(12) United States Patent
Su

(10) Patent No.: US 9,030,247 B2
(45) Date of Patent: May 12, 2015

(54) HIGH VOLTAGE TOLERANT INPUT/OUTPUT CIRCUIT

(71) Applicant: Alchip Technologies, Ltd., Taipei (TW)

(72) Inventor: Wen-Hong Su, Taipei (TW)

(73) Assignee: Alchip Technologies, Ltd., Taipei (TW)

( * ) Notice: Subject to any disclaimer, the term of this patent is extended or adjusted under 35 U.S.C. 154(b) by 43 days.

(21) Appl. No.: 13/846,235

(22) Filed: Mar. 18, 2013

(65) Prior Publication Data

US 2014/0132328 A1 May 15, 2014

(30) Foreign Application Priority Data

Nov. 9, 2012 (TW) .............................. 101141715 A

(51) Int. Cl.
*H03K 5/08* (2006.01)
*H03K 19/003* (2006.01)
*H03K 19/0185* (2006.01)

(52) U.S. Cl.
CPC .. *H03K 19/00315* (2013.01); *H03K 19/018521* (2013.01)

(58) Field of Classification Search
CPC ............... H03K 19/00315; H03K 19/018521; H02M 3/158
USPC .................. 327/306, 309, 318–320, 322, 323
See application file for complete search history.

(56) References Cited

U.S. PATENT DOCUMENTS

| | | | |
|---|---|---|---|
| 5,874,836 | A | 2/1999 | Nowak et al. |
| 7,113,027 | B2 * | 9/2006 | Yamazaki et al. ............ 327/541 |
| 7,932,748 | B1 | 4/2011 | Ker et al. |
| 7,969,190 | B2 | 6/2011 | Chuang et al. |
| 7,986,171 | B2 | 7/2011 | Wang et al. |

FOREIGN PATENT DOCUMENTS

TW           M364897 U1      9/2009

* cited by examiner

*Primary Examiner* — Lincoln Donovan
*Assistant Examiner* — Diana J Cheng
(74) *Attorney, Agent, or Firm* — Birch, Stewart, Kolasch & Birch, LLP

(57) ABSTRACT

A high voltage tolerant I/O circuit of an electronic device is disclosed, including a voltage reducing circuit, a first node, a first transistor, a second transistor, and a control logic. The voltage reducing circuit is coupled with a signal pad and utilized for generating a reduced voltage according to an external voltage. When an internal voltage generated by an internal circuit of the electronic device is greater than the reduced voltage, the first node outputs the internal voltage as a first voltage. When the internal voltage is less than the reduced voltage, the first node outputs the reduced voltage as the first voltage. The first transistor is coupled with the signal pad and the first node. The second transistor is coupled with a second terminal of the first transistor and a fixed-voltage terminal. The control logic operates according to the first voltage to control switching operations of the second transistor.

17 Claims, 7 Drawing Sheets

HIGH VOLTAGE TOLERANT INPUT/OUTPUT CIRCUIT

CROSS-REFERENCE TO RELATED APPLICATIONS

This application claims the benefit of priority to Patent Application No. 101141715, filed in Taiwan on Nov. 9, 2012; the entirety of which is incorporated herein by reference for all purposes.

BACKGROUND

The present disclosure generally relates to an I/O circuit and, more particularly, to a high voltage tolerant I/O circuit for an electronic device.

In many electronic devices, an internal chip is typically designed to have an actual operating voltage lower than a nominal operating voltage of the electronic device. For example, the nominal operating voltage of some electronic devices is 5V, but the actual operating voltage of the internal chip is designed to be only 3.3V, or even lower to 1.1V. The reliability of the I/O circuit in the electronic device seriously affects the durability of the electronic device. Accordingly, an additional protection circuit is typically employed in the traditional I/O circuit to avoid the internal chip of the electronic device from damaging by an external voltage transmitted from a signal pad of the electronic device.

The protection circuit in the traditional I/O circuit operates according to an internal operating voltage generated by the internal chip of the electronic device. However, in some applications (such as the electronic devices using HDMI, I2C, or USB I/O interfaces), the core voltage of the internal chip and the internal operating voltage provided from the internal chip to the I/O circuit would be completely turned off when the internal chip needs not to operate. In this situation, the protection circuit in the I/O circuit is unable to operate. At this time, if the signal pad of the electronic device is still coupled with the external high voltage signal terminal, the external voltage received at the signal pad may easily damage the I/O circuit and the internal chip of the electronic device, thereby causing the electronic device to be malfunction or be damaged.

SUMMARY

In view of the foregoing, it can be appreciated that a substantial need exists for an I/O circuit of an electronic device that can tolerate an external voltage transmitted from a signal pad when a core voltage of an internal circuit in the electronic device is turned off.

An example embodiment of a high voltage tolerant I/O circuit for use in an electronic device comprising a signal pad and an internal circuit is disclosed. The I/O circuit comprises: a voltage reducing circuit, coupled with the signal pad and configured to operably generate a reduced voltage according to an external voltage transmitted from the signal pad; a first node, coupled with the internal circuit and an output terminal of the voltage reducing circuit and configured to operably provide a first voltage, wherein when an internal voltage generated by the internal circuit of the electronic device is greater than the reduced voltage, the first node outputs the internal voltage as the first voltage, and when the internal voltage is less than the reduced voltage, the first node outputs the reduced voltage as the first voltage; a first transistor, wherein a first terminal of the first transistor is coupled with the signal pad, and a control terminal of the first transistor is coupled with the first node; a second transistor, wherein a first terminal of the second transistor is coupled with a second terminal of the first transistor, and a second terminal of the second transistor is coupled with a fixed-voltage terminal; and a control logic, coupled with the first node and a control terminal of the second transistor and configured to operate according to the first voltage to control switching operations of the second transistor; wherein the external voltage is greater than the internal voltage.

An example embodiment of a high voltage tolerant I/O circuit for use in an electronic device comprising a signal pad and an internal circuit is disclosed. The I/O circuit comprises: a voltage reducing circuit, coupled with the signal pad and configured to operably generate a reduced voltage according to an external voltage transmitted from the signal pad; a first node, coupled with the internal circuit and an output terminal of the voltage reducing circuit and configured to operably provide a first voltage, wherein when an internal voltage generated by the internal circuit of the electronic device is greater than the reduced voltage, the first node outputs the internal voltage as the first voltage, and when the internal voltage is less than the reduced voltage, the first node outputs the reduced voltage as the first voltage; a third transistor, wherein a control terminal of the third transistor is coupled with the first node, and a second terminal of the third transistor is coupled with the signal pad; and an inverter, coupled with the first node and a first terminal of the third transistor and configured to operate according to the first voltage to process a signal provided by the first terminal of the third transistor; wherein the external voltage is greater than the internal voltage.

An example embodiment of a high voltage tolerant I/O circuit for use in an electronic device comprising a signal pad and an internal circuit is disclosed. The I/O circuit comprises: a voltage reducing circuit, coupled with the signal pad and configured to operably generate a reduced voltage according to an external voltage transmitted from the signal pad; a first node, coupled with an output terminal of the voltage reducing circuit and configured to operably provide a first voltage; a first switch coupled between the first node and an internal voltage generated by the internal circuit; a control circuit, coupled with a control terminal of the first switch and configured to operably turn on the first switch when the internal voltage rises to a first reference voltage, and to operably turn off the first switch when the internal voltage declines to a second reference voltage; a first transistor, wherein a first terminal of the first transistor is coupled with the signal pad, and a control terminal of the first transistor is coupled with the first node; a second transistor, wherein a first terminal of the second transistor is coupled with a second terminal of the first transistor, and a second terminal of the second transistor is coupled with a fixed-voltage terminal; and a control logic, coupled with the internal voltage and a control terminal of the second transistor and configured to operate according to the internal voltage to control switching operations of the second transistor; wherein the external voltage is greater than the internal voltage, the first reference voltage, and the second reference voltage, and the first reference voltage is less than the second reference voltage.

An example embodiment of a high voltage tolerant I/O circuit for use in an electronic device comprising a signal pad and an internal circuit is disclosed. The I/O circuit comprises: a voltage reducing circuit, coupled with the signal pad and configured to operably generate a reduced voltage according to an external voltage transmitted from the signal pad; a first node, coupled with an output terminal of the voltage reducing circuit and configured to operably provide a first voltage; a first switch coupled between the first node and an internal voltage generated by the internal circuit; a control circuit, coupled with a control terminal of the first switch and configured to operably turn on the first switch when the internal voltage rises to a first reference voltage, and to operably turn off the first switch when the internal voltage declines to a second reference voltage; a third transistor, wherein a control terminal of the third transistor is coupled with the first node, and a second terminal of the third transistor is coupled with the signal pad; and an inverter, coupled with the first node and a first terminal of the third transistor and configured to operate according to the first voltage to process a signal provided by the first terminal of the third transistor; wherein the external voltage is greater than the internal voltage, the first reference voltage, and the second reference voltage, and the first reference voltage is less than the second reference voltage.

One of the advantages of the previous example embodiments is that the I/O circuit has higher tolerance for external voltage and capable of effectively avoiding elements of the I/O circuit from electrical over stress, thereby greatly improving the reliability of the I/O circuit.

Other advantages of the present disclosure will be further explained by the following description and drawings.

It is to be understood that both the foregoing general description and the following detailed description are example and explanatory only and are not restrictive of the invention, as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
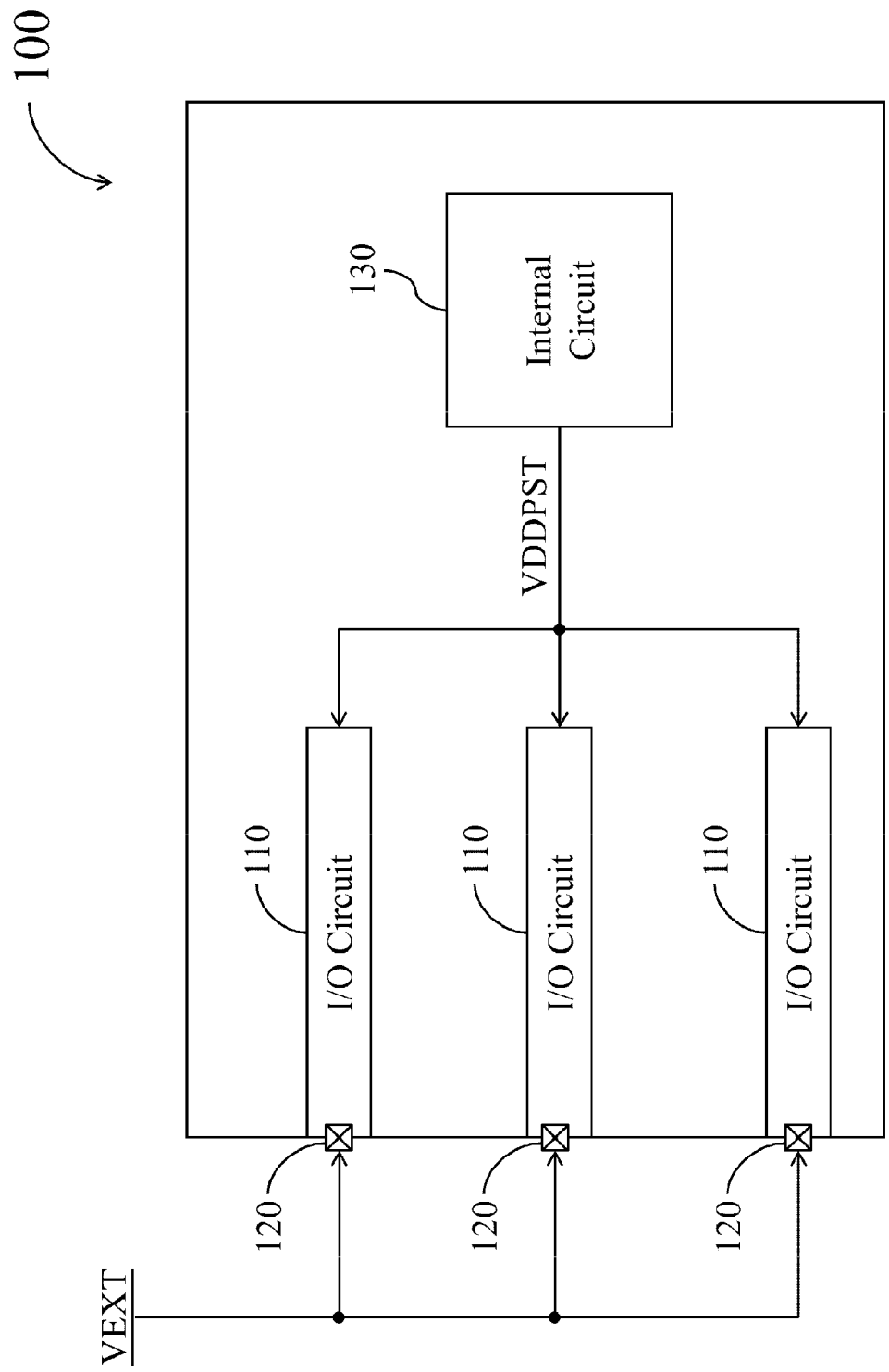
FIG. 1 shows a simplified functional block diagram of an electronic device according to one embodiment of the present disclosure.

FIG. 1 shows a simplified functional block diagram of an electronic device 100 according to one embodiment of the present disclosure. As shown in FIG. 1, the electronic device 100 comprises a plurality of high voltage tolerant input and output (I/O) circuits 110, a plurality of signal pads 120, and an internal circuit 130. The signal pad 120 is utilized for coupling with a high voltage signal terminal outside the electronic device 100 to receive an external voltage VEXT provided by an external device. The I/O circuit 110 is coupled between the signal pad 120 and the internal circuit 130 and configured to be a communication bridging between the internal circuit 130 and the external device. In practice, the internal circuit 130 may be a circuit or a chip for various purposes.

In practical applications, the previous I/O circuit 110 may be the input and output circuit applied in various communication interfaces, such as HDMI, I2C, or USB interface. The implementations and operations of the I/O circuit 110 will be further described below with reference to FIG. 2 to FIG. 7.

Figure 2:
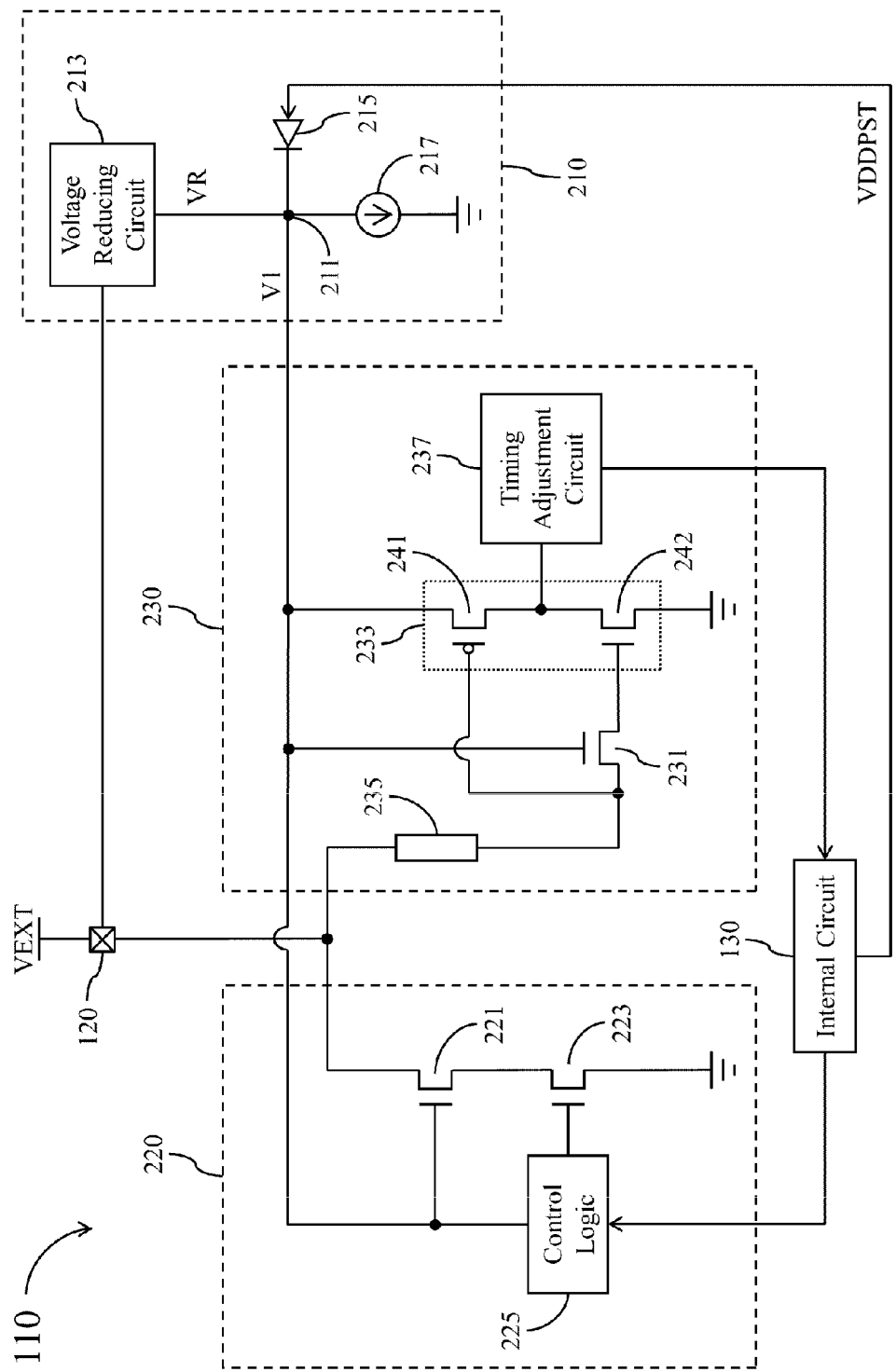
FIGS. 2-7 show simplified functional block diagrams of an I/O circuit in FIG. 1 according to several embodiments of the present disclosure.

FIG. 2 shows a simplified functional block diagram of the I/O circuit 110 according to a first embodiment of the present disclosure. The I/O circuit 110 comprises a voltage decision circuit 210, an output buffer circuit 220, and an input buffer circuit 230. The output buffer circuit 220 is utilized for buffering signals transmitted from the internal circuit 130 to outside the electronic device 100. The input buffer circuit 230 is utilized for buffering signals transmitted from outside the electronic device 100 to the internal circuit 130. The voltage decision circuit 210 is coupled with the signal pad 120, the internal circuit 130, the output buffer circuit 220, and the input buffer circuit 230. The voltage decision circuit 210 is configured to operably control operations of the output buffer circuit 220 and the input buffer circuit 230 to prevent elements inside the I/O circuit 110 or elements inside the internal circuit 130 from damaging by the external voltage VEXT coupled with the signal pad 120.

In this embodiment, the voltage decision circuit 210 comprises a first node 211, a voltage reducing circuit 213, a diode 215, and a constant current controller 217. The first node 211 is coupled with the internal circuit 130 and an output terminal of the voltage reducing circuit 213 and utilized for providing a first voltage V1. The voltage reducing circuit 213 is coupled with the signal pad 120 and configured to operably generate a reduced voltage VR according to the external voltage VEXT transmitted from the signal pad 120. The diode 215 is coupled between the first node 211 and the internal circuit 130. The diode 215 is utilized for transmitting an internal voltage VDDPST generated by the internal circuit 130 to the first node 211 and for preventing back current flowing to the transmission path of the internal voltage VDDPST. The constant current controller 217 is coupled with the first node 211 and configured to operably control an output current of the first node 211 to stabilize the output current of the first node 211, thereby stabilizing the first voltage V1 provided by the first node 211. In practice, the voltage reducing circuit 213 may be realized with any circuit capable of reducing the voltage of the external voltage VEXT. For example, the voltage reducing circuit 213 may be realized with a plurality of serially-connected transistors or a plurality of serially-connected resistors. In addition, the diode 215 may be replaced by other device having similar functionality.

As shown in FIG. 2, the output buffer circuit 220 comprises a first transistor 221, a second transistor 223, and a control logic 225. A first terminal of the first transistor 221 is coupled with the signal pad 120, and a control terminal of the first transistor 221 is coupled with the first node 211. A first terminal of the second transistor 223 is coupled with a second terminal of the first transistor 221, and a second terminal of the second transistor 223 is coupled with a fixed-voltage terminal, such as a grounded terminal. The control logic 225 is coupled with the first node 211 and a control terminal of the second transistor 223. The control logic 225 utilizes the first voltage V1 as its operating voltage and operates according to the first voltage V1. The control logic 225 is configured to control switching operations of the second transistor 223 according to signals transmitted from the internal circuit 130. In practice, the first transistor 221 and the second transistor 223 may be realized with two NMOS transistors. Other transistors may be coupled between the second terminal of the first transistor 221 and the first terminal of the second transistor 223.

The input buffer circuit 230 comprises a third transistor 231, an inverter 233, an electrostatic discharge (ESD) protection device 235, and a timing adjustment circuit 237. A control terminal of the third transistor 231 is coupled with the first node 211, and a second terminal of the third transistor 231 is coupled with the signal pad 120 through the ESD protection device 235. The inverter 233 is coupled with the first node 211 and a first terminal of the third transistor 231. The inverter 233 utilizes the first voltage V1 as its operating voltage and operates according to the first voltage V1. The inverter 233 is configured to operably process the signal at the first terminal of the third transistor 231. In this embodiment, the inverter 233 comprises serially-connected transistors 241 and 242, wherein a control terminal of the transistor 241 is coupled with the second terminal of the third transistor 231, and a control terminal of the transistor 242 is coupled with the first terminal of the third transistor 231. The timing adjustment circuit 237 is coupled with an output terminal of the inverter 233. The timing adjustment circuit 237 is configured to operably adjust the timing or voltage of the signal outputted from the inverter 233, and to transmit the adjusted signal to the internal circuit 130. In practice, the ESD protection device 235 may be realized with resistance elements, and the timing adjustment circuit 237 may be realized with a plurality of serially-connected buffers or inverters. In practice, the third transistor 231 may be realized with a NMOS transistor.

As can be appreciated from the foregoing descriptions that in the embodiment of FIG. 2, the first voltage V1 provided by the first node 211 is not only utilized for controlling operations of the first transistor 221 and the third transistor 231, but also utilized as the operating voltage of the control logic 225 and the inverter 233.

In the I/O circuit 110 of FIG. 2, the external voltage VEXT transmitted from the signal pad 120 is greater than the internal voltage VDDPST generated by the internal circuit 130. For example, in one embodiment, the external voltage VEXT is 5V, the internal voltage VDDPST is 3.3V, and the reduced voltage VR is 2.3V. When the internal voltage VDDPST generated by the internal circuit 130 is greater than the reduced voltage VR generated by the voltage reducing circuit 213, the first node 211 outputs the internal voltage VDDPST to be the first voltage V1. On the contrary, when the reduced voltage VR is greater than the internal voltage VDDPST, the first node 211 outputs the reduced voltage VR to be the first voltage V1.

Therefore, when a core voltage of the internal circuit 130 is turned off, or the internal voltage VDDPST is not yet generated by the internal circuit 130, even the signal pad 120 is coupled with the external voltage VEXT, the voltage decision circuit 210 does not directly transmit the external voltage VEXT to the output buffer circuit 220, the input buffer circuit 230, and the internal circuit 130. Instead, the voltage decision circuit 210 utilizes the reduced voltage VR generated based on the external voltage VEXT by the voltage reducing circuit 213 to control the output buffer circuit 220 and the input buffer circuit 230, to protect the elements in the output buffer circuit 220 and the input buffer circuit 230 from electrical over stress.

Figure 3:
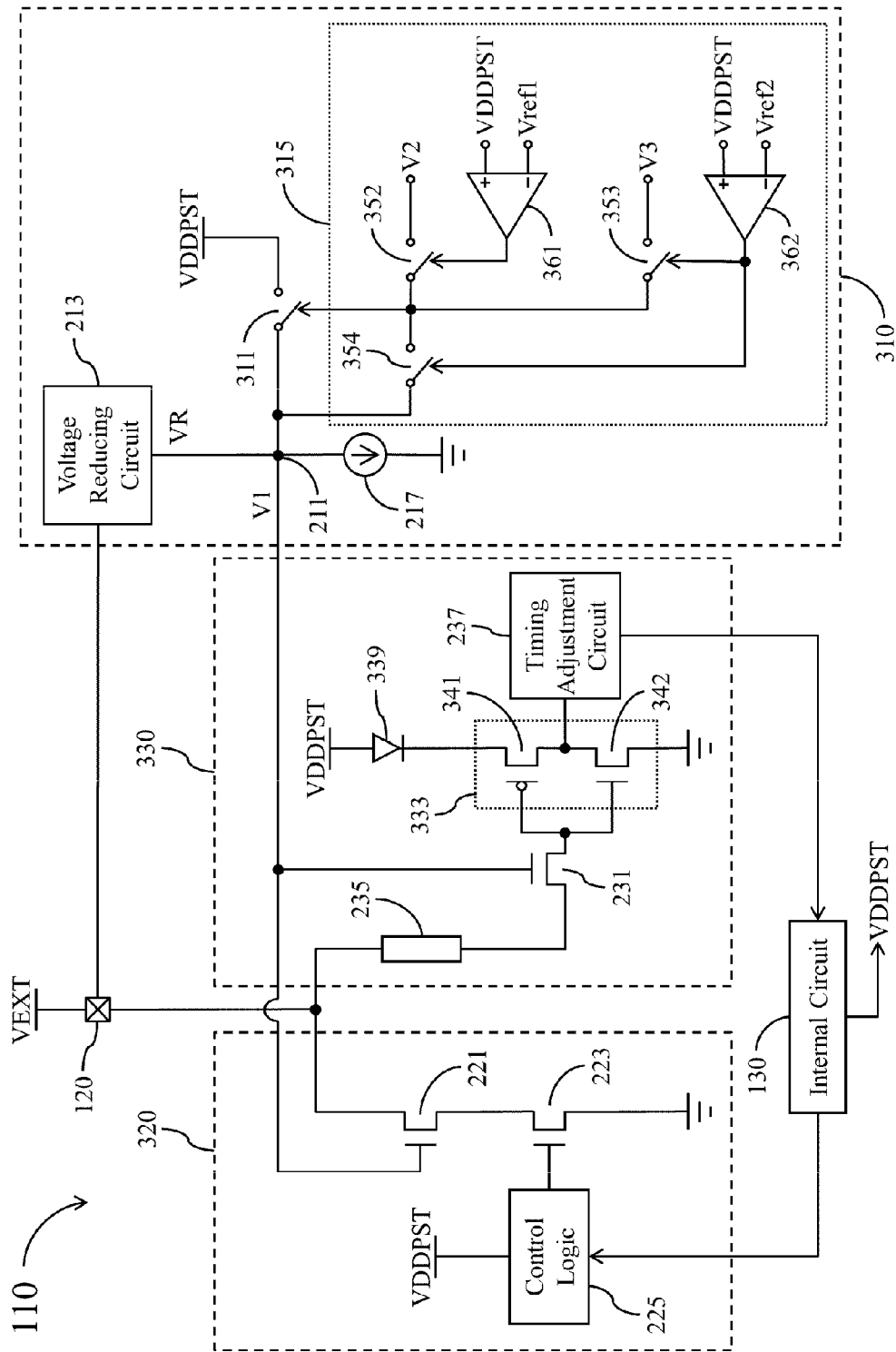
Figure 4:
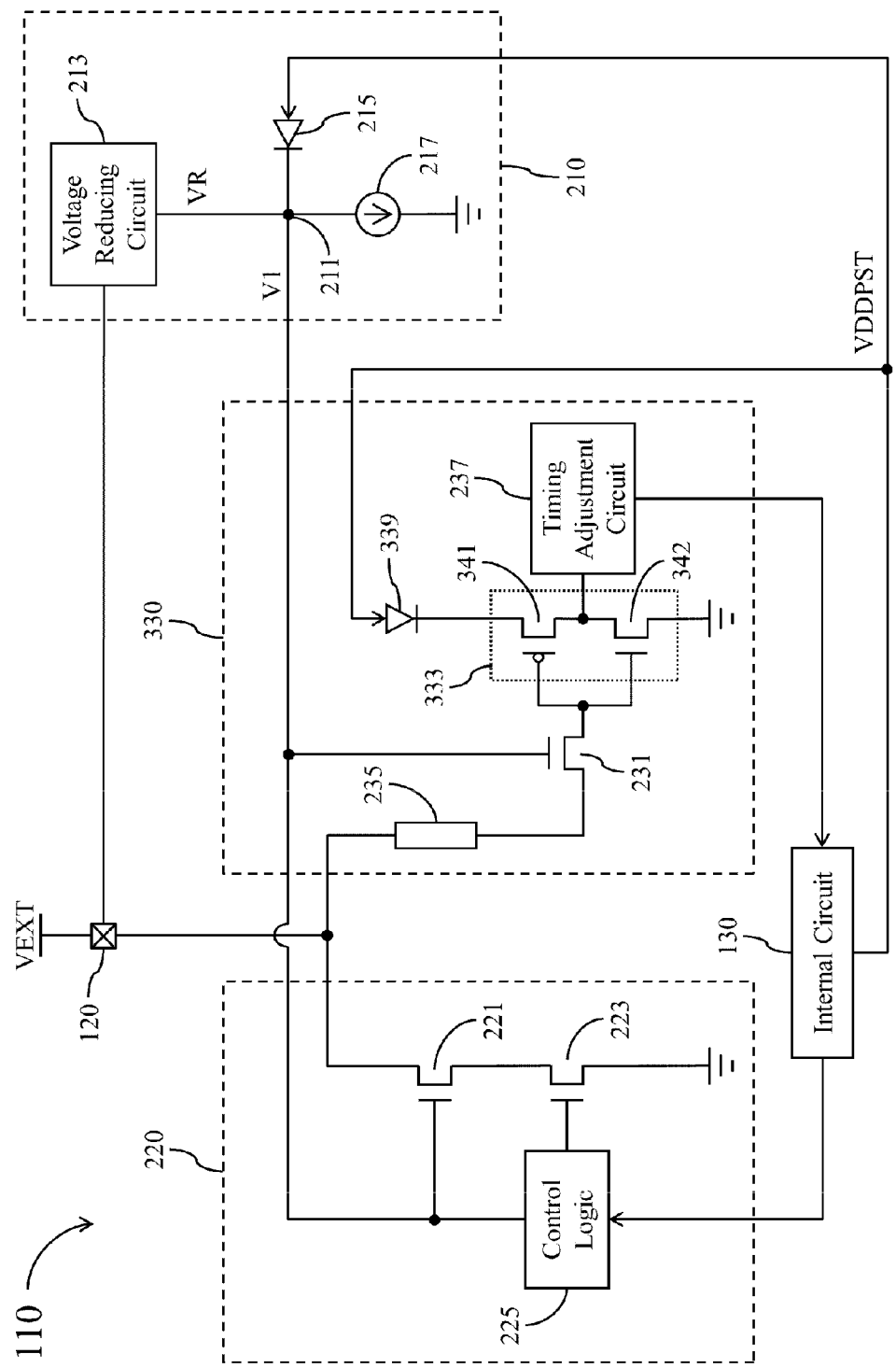
Figure 5:
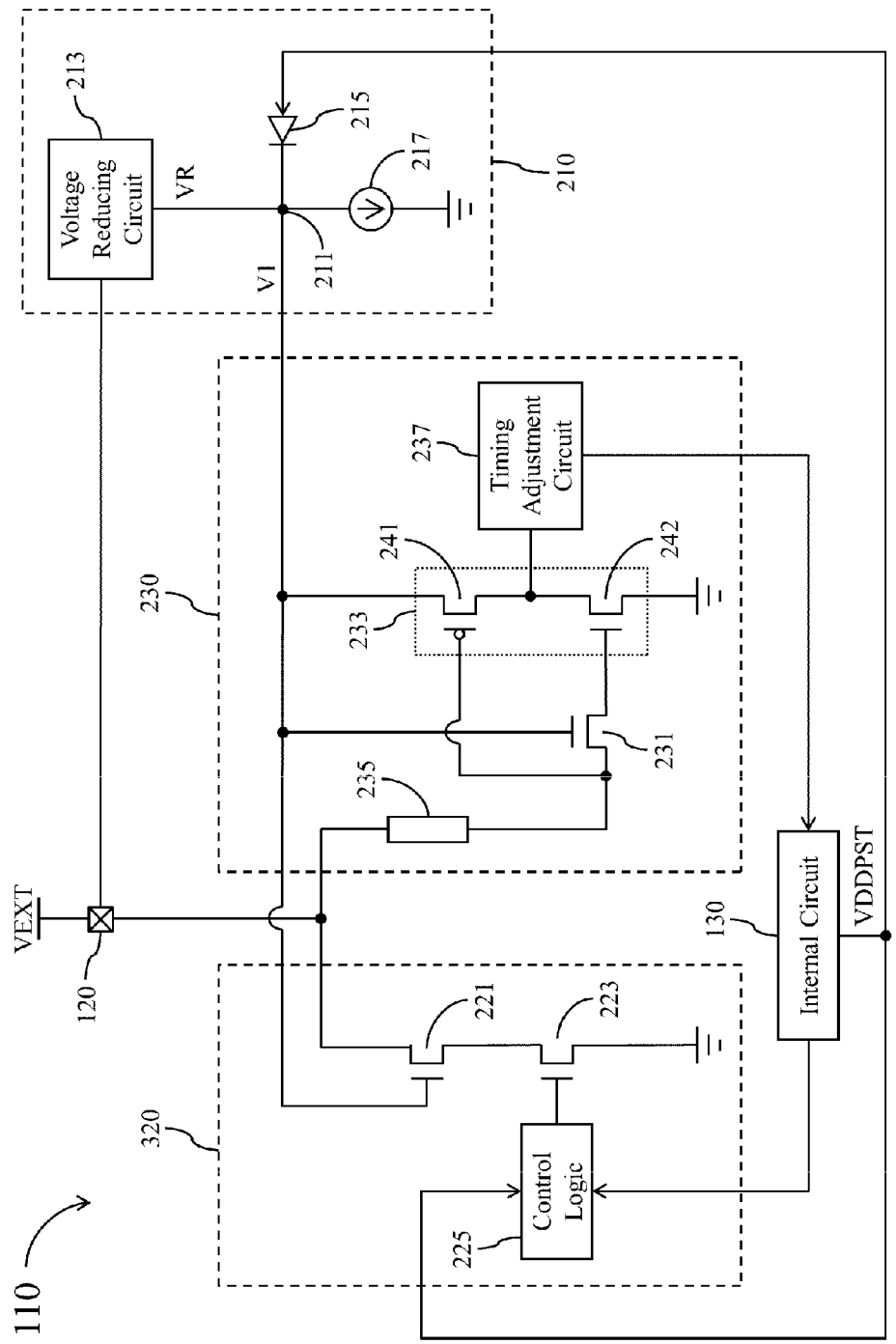
Figure 6:
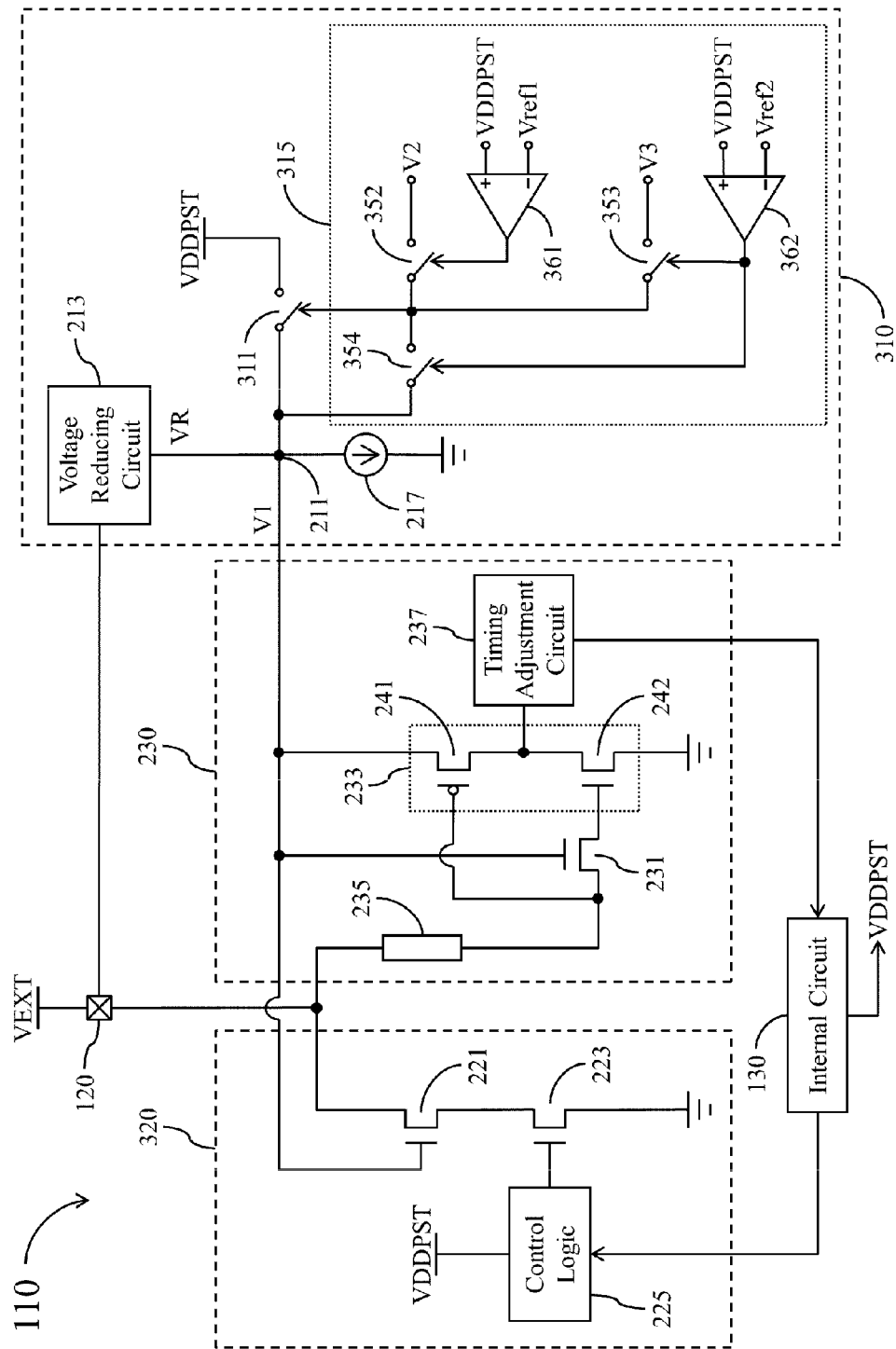
Figure 7:
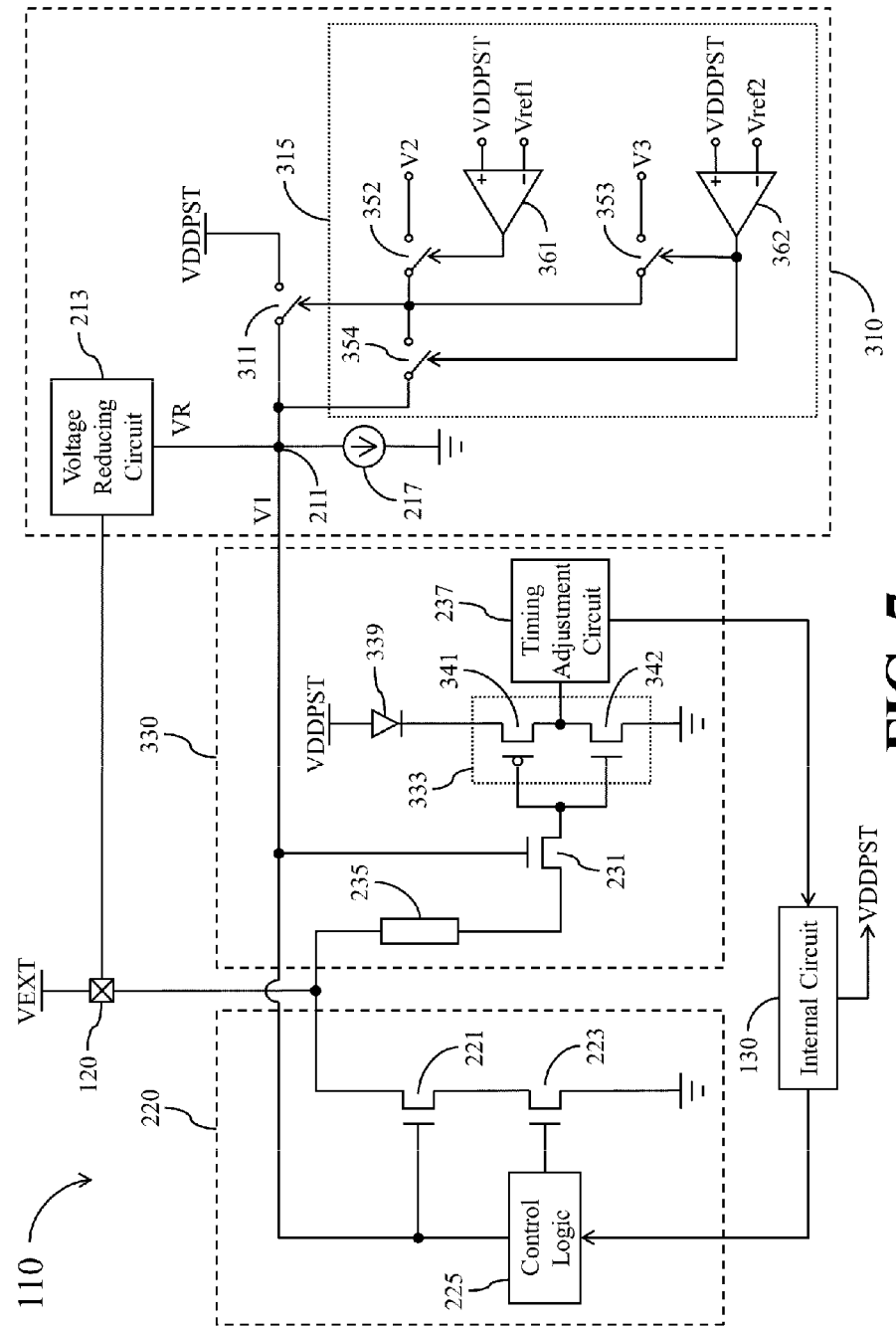

FIG. 3 shows a simplified functional block diagram of the I/O circuit 110 according to a second embodiment of the present disclosure. The I/O circuit 110 comprises a voltage decision circuit 310, an output buffer circuit 320, and an input buffer circuit 330. The output buffer circuit 320 is utilized for buffering signals transmitted from the internal circuit 130 to outside the electronic device 100. The input buffer circuit 330 is utilized for buffering the signals transmitted from outside the electronic device 100 to the internal circuit 130. The voltage decision circuit 310 is coupled with the signal pad 120, the internal circuit 130, the output buffer circuit 320, and the input buffer circuit 330. The voltage decision circuit 310 is configured to operably control operations of the output buffer circuit 320 and the input buffer circuit 330 to prevent the elements inside the I/O circuit 110 or the elements inside the internal circuit 130 from damaging by the external voltage VEXT coupled with the signal pad 120.

In this embodiment, the voltage decision circuit 310 comprises the first node 211, the voltage reducing circuit 213, the constant current controller 217, a first switch 311, and a control circuit 315. The first node 211 is coupled with the internal circuit 130 and the output terminal of the voltage reducing circuit 213 and utilized for providing a first voltage V1. The voltage reducing circuit 213 is coupled with the signal pad 120 and configured to operably generate a reduced voltage VR according to the external voltage VEXT transmitted from the signal pad 120. The constant current controller 217 is coupled with the first node 211 and configured to operably control the output current of the first node 211 to stabilize the output current of the first node 211, thereby stabilizing the first voltage V1 provided by the first node 211. The first switch 311 is coupled between the first node 211 and the internal voltage VDDPST generated by the internal circuit 130. The control circuit 315 is coupled with a control terminal of the first switch 311 and configured to operably turn on the first switch 311 when the internal voltage VDDPST rises to a first reference voltage Vref1. The control circuit 315 is also configured to operably turn off the first switch 311 when the internal voltage VDDPST declines to a second reference voltage Vref2. In the embodiment of FIG. 3, the external voltage VEXT transmitted from the signal pad 120 is greater than the first reference voltage Vref1, the second reference voltage Vref2, and the internal voltage VDDPST generated by the internal circuit 130, and the first reference voltage Vref1 is less than the second reference voltage Vref2.

As shown in FIG. 3, the output buffer circuit 320 is similar to the aforementioned output buffer circuit 220, and one difference between the two embodiments is that the control logic 225 of the output buffer circuit 320 is coupled with the internal voltage VDDPST and the control terminal of the second transistor 223. The control logic 225 of the output buffer circuit 320 utilizes the internal voltage VDDPST as its operating voltage and operates according to the internal voltage VDDPST. The control logic 225 of the output buffer circuit 320 is configured to operably control switching operations of the second transistor 223 according to the signal transmitted from the internal circuit 130. The implementations and operations of other elements in the output buffer circuit 320 are the same as the corresponding elements in the previous output buffer circuit 220. Accordingly, the descriptions regarding the operations and implementations of other elements in the previous output buffer circuit 220 are also applicable to the output buffer circuit 320.

The input buffer circuit 330 is similar to the previous input buffer circuit 230, and one difference between the two embodiments is that an inverter 333 of the input buffer circuit 330 is coupled with the internal voltage VDDPST and the first terminal of the third transistor 231. The inverter 333 utilizes the internal voltage VDDPST as its operating voltage and operates according to the internal voltage VDDPST. The inverter 333 is configured to operably process the signal provided by the first terminal of the third transistor 231. A diode 339 or devices with similar functionality may be arranged between the inverter 333 and the internal voltage VDDPST to transmit the internal voltage VDDPST generated by the internal circuit 130 to the inverter 333, and to prevent back current flowing to the transmission path of the internal voltage VDDPST. In this embodiment, the inverter 333 comprises serially-connected transistors 341 and 342, wherein a control terminal of the transistor 341 and a control terminal of the transistor 342 are both coupled with the first terminal of the third transistor 231. The implementations and operations of other elements in the input buffer circuit 330 are the same as the corresponding elements in the previous input buffer circuit 230. Accordingly, the descriptions regarding the operations and implementations of other elements in the previous input buffer circuit 230 are also applicable to the input buffer circuit 330.

As shown in FIG. 3, the control circuit 315 of the voltage decision circuit 310 comprises a second switch 352, a third switch 353, a fourth switch 354, a first comparing circuit 361, and a second comparing circuit 362. The second switch 352 is coupled between a second voltage V2 and the control terminal of the first switch 311. The third switch 353 is coupled between a third voltage V3 and the control terminal of the first switch 311. The fourth switch 354 is coupled between the first node 211 and the control terminal of the first switch 311. The first comparing circuit 361 is coupled with a control terminal of the second switch 352 and configured to operably compare the internal voltage VDDPST with the first reference voltage Vref1 to control switching operations of the second switch 352. The second comparing circuit 362 is coupled with a control terminal of the third switch 353 and configured to operably compare the internal voltage VDDPST with the second reference voltage Vref2 to control switching operations of the third switch 353 and the fourth switch 354.

In practice, different functional blocks of the control circuit 315 may be respectively realized with different circuit elements. Alternatively, different functional blocks of the control circuit 315 may be realized with the same circuit element. For example, each of the first switch 311, the third switch 353, and the fourth switch 354 may be realized with a PMOS transistor, and the second switch 352 may be realized with a NMOS transistor. Alternatively, the functionalities of the second switch 352 and the first comparing circuit 361 may be realized with a single NMOS transistor, and the functionalities of the third switch 353 and the second comparing circuit 362 may be realized with a single PMOS transistor.

In the I/O circuit 110 of FIG. 3, the external voltage VEXT transmitted from the signal pad 120 is greater than the first reference voltage Vref1, the second reference voltage Vref2, and the internal voltage VDDPST generated by the internal circuit 130. The first reference voltage Vref1 is less than the second reference voltage Vref2, and the second voltage V2 is less than the third voltage V3. In addition, the first reference voltage Vref1 may be a fixed voltage, or may be directly proportional to the second voltage V2. Similarly, the second reference voltage Vref2 may be a fixed voltage, or may be directly proportional to the third voltage V3.

For example, in one embodiment, the external voltage VEXT is 5V, the internal voltage VDDPST is 3.3V, the reduced voltage VR is 2.5V, the second voltage V2 is 2V, the third voltage V3 is 2.9V, the first reference voltage Vref1 may be a result obtained by summing the second voltage V2 and a first predetermined value Vth1 (such as 0.5V), and the second reference voltage Vref2 may be a result obtained by subtracting a second predetermined value Vth2 (such as 0.5V) from the third voltage V3. As can be appreciated from the foregoing descriptions that in the embodiment of FIG. 3, the first voltage V1 outputted from the first node 211 is only utilized for controlling the operations of the first transistor 221 and the third transistor 231, and not utilized to be the operating voltage of the control logic 225 and the inverter 333.

Accordingly, when the core voltage of the internal circuit 130 is turned off, and the internal voltage VDDPST is not yet generated by the internal circuit 130, if the signal pad 120 is coupled with the external voltage VEXT, the first voltage V1 at the first node 211 would be rapidly pulled up to 2.5V by the reduced voltage VR because the load is lowered. This mechanism not only protects the elements inside the output buffer circuit 320 and the elements inside the input buffer circuit 330 from electrical over stress, but also effectively increases the response speed of the I/O circuit 110 with respect to the external voltage VEXT.

Afterwards, the internal circuit 130 would be activated and begin to generate the internal voltage VDDPST. When the internal voltage VDDPST gradually rises from 0V to 3.3V, the control circuit 315 utilizes the comparing circuits 361 and 362 to compare the internal voltage VDDPST with the first reference voltage Vref1 and the second reference voltage Vref2. Before the internal voltage VDDPST rises to the level of the first reference voltage Vref1 (such as 2.5V), the control circuit 315 does not turn on the first switch 311. Accordingly, the first voltage V1 provided by the first node 211 remains 2.5V. When the internal voltage VDDPST rises to a level exceeding the first reference voltage Vref1, the comparing circuit 361 turns on the second switch 352 to conduct the second voltage V2 to the control terminal of the first switch 311 so as to turn on the first switch 311. When the first switch 311 is turned on, the first node 211 is connected to the internal voltage VDDPST. Then, the first voltage V1 provided by the first node 211 would gradually rise to 3.3V with the internal voltage VDDPST. Therefore, while the internal voltage VDDPST gradually rises from 0V to 3.3V, the first voltage V1 provided by the first node 211 can effectively protect the elements inside the output buffer circuit 320 and the elements inside the input buffer circuit 330 from electrical over stress.

Afterwards, when the electronic device 100 decides to turn off the core voltage of the internal circuit 130 and stops the operations of the internal circuit 130 (including the generation of the internal voltage VDDPST), the internal voltage VDDPST would gradually decline from 3.3V. Before the internal voltage VDDPST declines to the level of the second reference voltage (such as 2.4V), the control circuit 315 maintains the first switch 311 in the turn on status, so that the first voltage V1 provided by the first node 211 gradually declines with the internal voltage VDDPST. When the internal voltage VDDPST declines to a level less than the second reference voltage Vref2, the comparing circuit 362 turns on the third switch 353 to conduct the third voltage V3 to the control terminal of the first switch 311, so as to turn off the first switch 311. At the same time, the comparing circuit 362 turns on the fourth switch 354 to conduct the third voltage V3 to the first node 211, to rapidly pull the first voltage V1 to the level of the third voltage V3 (i.e. 2.9V). Accordingly, while the internal voltage VDDPST gradually declines from 3.3V to 0V, the first voltage V1 provided by the first node 211 can effectively protect the elements inside the output buffer circuit 320 and the elements inside the input buffer circuit 330 from electrical over stress.

In practice, the output buffer circuit 220 and the input buffer circuit 230 in the previous embodiment of FIG. 2 can be respectively combined with the input buffer circuit 330 and the output buffer circuit 320 in the embodiment of FIG. 3 to realize different types of I/O circuit.

For example, FIGS. 4-7 show simplified functional block diagrams of the I/O circuit 110 according to different embodiments of the present disclosure. In comparison with the embodiment of FIG. 2, the I/O circuit 110 of FIG. 4 utilizes the input buffer circuit 330 of FIG. 3 to replace the input buffer circuit 230 of FIG. 2. In comparison with the embodiment of FIG. 2, the I/O circuit 110 of FIG. 5 utilizes the output buffer circuit 320 of FIG. 3 to replace the output buffer circuit 220 of FIG. 2. In comparison with the embodiment of FIG. 3, the I/O circuit 110 of FIG. 6 utilizes the input buffer circuit 230 of FIG. 2 to replace the input buffer circuit 330 of FIG. 3. In comparison with the embodiment of FIG. 3, the I/O circuit 110 of FIG. 7 utilizes the output buffer circuit 220 of FIG. 2 to replace the output buffer circuit 320 of FIG. 3.

The structure of the aforementioned voltage decision circuit 210 is merely an embodiment, rather than a restriction to the practical implementations of the voltage decision circuit 210. For example, in one embodiment, the constant current controller 217 in the voltage decision circuit 210 may be omitted. In practice, the constant current controller 217 and/or the fourth switch 354 in the voltage decision circuit 310 may be omitted.

As can be appreciated from the foregoing descriptions that when the core voltage of the internal circuit 130 is turned off, and the internal voltage VDDPST is not yet generated by the internal circuit 130, even if the signal pad 120 is coupled with higher external voltage VEXT, the voltage decision circuit 210 (or 310) of the I/O circuit 110 in each of the previous embodiments generates a lower reduced voltage VR according to the external voltage VEXT to control the related output buffer circuit and input buffer circuit, and does not directly conduct the external voltage VEXT to the input buffer circuit, the output buffer circuit, and the internal circuit 130. Accordingly, the operations of the disclosed voltage decision circuit 210 or 310 enable the I/O circuit 110 to have greater tolerance to the external voltage VEXT, and effectively protect the elements inside the I/O circuit 110 from electrical over stress, thereby greatly improving the reliability of the I/O circuit 110.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A high voltage tolerant I/O circuit for use in an electronic device comprising a signal pad and an internal circuit, the I/O circuit comprising:
   a voltage reducing circuit, coupled with the signal pad and configured to operably generate a reduced voltage according to an external voltage transmitted from the signal pad;
   a first node, coupled with an output terminal of the voltage reducing circuit and configured to operably provide a first voltage;
   a first switch coupled between the first node and an internal voltage generated by the internal circuit;
   a control circuit, coupled with a control terminal of the first switch and configured to operably turn on the first switch when the internal voltage rises to a first reference voltage, and to operably turn off the first switch when the internal voltage declines to a second reference voltage;
   a first transistor, wherein a first terminal of the first transistor is coupled with the signal pad, and a control terminal of the first transistor is coupled with the first node;
   a second transistor, wherein a first terminal of the second transistor is coupled with a second terminal of the first transistor, and a second terminal of the second transistor is coupled with a fixed-voltage terminal; and
   a control logic, coupled with the internal voltage and a control terminal of the second transistor and configured to operate according to the internal voltage to control switching operations of the second transistor;
   wherein the external voltage is greater than the internal voltage, the first reference voltage, and the second reference voltage, and the first reference voltage is less than the second reference voltage;
   wherein the control circuit comprises:
   a second switch coupled between a second voltage and the control terminal of the first switch;
   a first comparing circuit, coupled with a control terminal of the second switch and configured to operably compare the internal voltage with the first reference voltage to control switching operations of the second switch;
   a third switch coupled between a third voltage and the control terminal of the first switch; and
   a second comparing circuit, coupled with a control terminal of the third switch and configured to operably compare the internal voltage with the second reference voltage to control switching operations of the third switch.

2. The I/O circuit of claim 1, further comprising:
   a third transistor, wherein a control terminal of the third transistor is coupled with the first node, and a second terminal of the third transistor is coupled with the signal pad; and
   an inverter, coupled with the internal voltage and a first terminal of the third transistor and configured to operate according to the internal voltage to process a signal provided by the first terminal of the third transistor.

3. The I/O circuit of claim 1, further comprising:
   a third transistor, wherein a control terminal of the third transistor is coupled with the first node, and a second terminal of the third transistor is coupled with the signal pad; and
   an inverter, coupled with the first node and a first terminal of the third transistor and configured to operate according to the first voltage to process a signal provided by the first terminal of the third transistor.

4. The I/O circuit of claim 1, further comprising:
   a constant current controller, coupled with the first node and configured to operably control an output current of the first node.

5. The I/O circuit of claim 1, wherein the control circuit further comprises:
   a fourth switch coupled between the first node and the control terminal of the first switch;
   wherein the second comparing circuit controls switching operations of the fourth switch according to comparison results of the internal voltage and the second reference voltage.

6. The I/O circuit of claim 5, wherein the second switch and the first comparing circuit are realized by a single transistor, and the third switch and the second comparing circuit are realized by another single transistor;

wherein the first reference voltage is directly proportional to the second voltage, the second reference voltage is directly proportional to the third voltage, and the second voltage is less than the third voltage.

7. The I/O circuit of claim 1, wherein the second switch and the first comparing circuit are realized by a single transistor, and the third switch and the second comparing circuit are realized by another single transistor.

8. The I/O circuit of claim 1, wherein the second switch and the first comparing circuit are realized by a single transistor.

9. The I/O circuit of claim 1, wherein the third switch and the second comparing circuit are realized by a single transistor.

10. A high voltage tolerant I/O circuit for use in an electronic device comprising a signal pad and an internal circuit, the I/O circuit comprising:
a voltage reducing circuit, coupled with the signal pad and configured to operably generate a reduced voltage according to an external voltage transmitted from the signal pad;
a first node, coupled with an output terminal of the voltage reducing circuit and configured to operably provide a first voltage;
a first switch coupled between the first node and an internal voltage generated by the internal circuit;
a control circuit, coupled with a control terminal of the first switch and configured to operably turn on the first switch when the internal voltage rises to a first reference voltage, and to operably turn off the first switch when the internal voltage declines to a second reference voltage;
a third transistor, wherein a control terminal of the third transistor is coupled with the first node, and a second terminal of the third transistor is coupled with the signal pad; and
an inverter, coupled with the first node and a first terminal of the third transistor and configured to operate according to the first voltage to process a signal provided by the first terminal of the third transistor;
wherein the external voltage is greater than the internal voltage, the first reference voltage, and the second reference voltage, and the first reference voltage is less than the second reference voltage;
wherein the control circuit comprises:
a second switch coupled between a second voltage and the control terminal of the first switch:
a first comparing circuit, coupled with a control terminal of the second switch and configured to operably compare the internal voltage with the first reference voltage to control switching operations of the second switch;
a third switch coupled between a third voltage and the control terminal of the first switch; and
a second comparing circuit, coupled with a control terminal of the third switch and configured to operably compare the internal voltage with the second reference voltage to control switching operations of the third switch.

11. The I/O circuit of claim 10, further comprising:
a first transistor, wherein a first terminal of the first transistor is coupled with the signal pad, and a control terminal of the first transistor is coupled with the first node;
a second transistor, wherein a first terminal of the second transistor is coupled with a second terminal of the first transistor, and a second terminal of the second transistor is coupled with a fixed-voltage terminal; and
a control logic, coupled with the first node and a control terminal of the second transistor and configured to operate according to the first voltage to control switching operations of the second transistor.

12. The I/O circuit of claim 10, further comprising:
a constant current controller, coupled with the first node and configured to operably control an output current of the first node.

13. The I/O circuit of claim 10, wherein the control circuit further comprises:
a fourth switch coupled between the first node and the control terminal of the first switch;
wherein the second comparing circuit controls switching operations of the fourth switch according to comparison results of the internal voltage and the second reference voltage.

14. The I/O circuit of claim 13, wherein the second switch and the first comparing circuit are realized by a single transistor, and the third switch and the second comparing circuit are realized by another single transistor;
wherein the first reference voltage is directly proportional to the second voltage, the second reference voltage is directly proportional to the third voltage, and the second voltage is less than the third voltage.

15. The I/O circuit of claim 10, wherein the second switch and the first comparing circuit are realized by a single transistor, and the third switch and the second comparing circuit are realized by another single transistor.

16. The I/O circuit of claim 10, wherein the second switch and the first comparing circuit are realized by a single transistor.

17. The I/O circuit of claim 10, wherein the third switch and the second comparing circuit are realized by a single transistor.

* * * * *